United States Patent
Ning et al.

(10) Patent No.: US 11,296,194 B2
(45) Date of Patent: Apr. 5, 2022

(54) METHOD FOR MANUFACTURING NON-VOLATILE MEMORY

(71) Applicant: Chengdu Analog Circuit Technology Inc, Chengdu (CN)

(72) Inventors: Dan Ning, Chengdu (CN); Tengfeng Wang, Chengdu (CN)

(73) Assignee: Chengdu Analog Circuit Technology Inc, Chengdu (CN)

( * ) Notice: Subject to any disclaimer, the term of this patent is extended or adjusted under 35 U.S.C. 154(b) by 0 days.

(21) Appl. No.: 16/848,168

(22) Filed: Apr. 14, 2020

(65) Prior Publication Data
US 2020/0243653 A1    Jul. 30, 2020

Related U.S. Application Data

(63) Continuation of application No. PCT/CN2017/109171, filed on Nov. 2, 2017.

(51) Int. Cl.
| | |
|---|---|
| H01L 21/28 | (2006.01) |
| H01L 27/11524 | (2017.01) |
| H01L 29/66 | (2006.01) |
| H01L 21/3213 | (2006.01) |
| H01L 29/49 | (2006.01) |

(52) U.S. Cl.
CPC .. *H01L 29/40114* (2019.08); *H01L 21/32133* (2013.01); *H01L 27/11524* (2013.01); *H01L 29/4916* (2013.01); *H01L 29/66825* (2013.01)

(58) Field of Classification Search
CPC ......... H01L 29/40114; H01L 21/32133; H01L 27/11524; H01L 29/4916; H01L 29/66825; H01L 27/11534
See application file for complete search history.

(56) References Cited

U.S. PATENT DOCUMENTS

| | | | |
|---|---|---|---|
| 7,868,373 B2 | 1/2011 | Hwang | |
| 9,012,317 B2 | 4/2015 | Chen | |
| 2006/0057794 A1* | 3/2006 | Youn | H01L 27/11526 438/197 |
| 2017/0125431 A1 | 5/2017 | Chen et al. | |

FOREIGN PATENT DOCUMENTS

| | | |
|---|---|---|
| CN | 101685820 A | 3/2010 |
| CN | 106356374 A | 1/2017 |

OTHER PUBLICATIONS

Internation Search Report of PCT/CN2017/109171, dated Aug. 1, 2018.

* cited by examiner

*Primary Examiner* — David Vu
(74) *Attorney, Agent, or Firm* — Andrew D. Fortney; Central California IP Group, P.C.

(57) ABSTRACT

The present invention relates to a method for manufacturing a nonvolatile memory, including the steps of: forming a gate oxide layer on a substrate; forming a stacked capacitor of a storage cell after making a logic gate polysilicon undertake at least two deposition processes; and removing the extra logic gate polysilicon by an etching process to form a storage transistor and a peripheral logic transistor. According to the method of the present invention, the stacked capacitor of the storage transistor is formed by depositing at least twice, and the memory is manufactured in a standard logic process, which makes the manufacturing process of the memory simpler, the memory has good compatibility with the logic process and has low cost.

18 Claims, 10 Drawing Sheets

METHOD FOR MANUFACTURING NON-VOLATILE MEMORY

CROSS-REFERENCE TO RELATED APPLICATIONS

This application is a continuation of international patent application PCT/CN2017/109171 with a filing date of Nov. 2, 2017. The content of the aforementioned application, including any intervening amendments thereto, are incorporated herein by reference.

TECHNICAL FIELD

The present invention relates to the field of memory technology, particularly to a method for manufacturing a nonvolatile memory.

TECHNICAL BACKGROUND

A nonvolatile memory, referred to as NVM, means that information stored in the memory can exist for a long time after power is turned off, and is not easy to lose, since the memory can be written for multiple times, be erased and disappear after electricity is disconnected, the memory is widely used in electronic equipment. Currently, the common nonvolatile memory has two types of structures, one is an Erasable and Programmable Read-Only Memory with a Tunnel Oxide (EPROM with Tunnel Oxide, ETOX), and the other is a two-transistor (2T) structure formed by connecting a selection transistor in series on one side of a storage cell. With the development of a system-on-chip (SOC), an embedded memory is widely used. However, in a current process, the manufacturing processes of the storage cell and a standard logic device are usually performed separately, resulting in complicated process steps, and more than a dozen photomasks need to be added based on a standard logic process, which increases cost and reduces competitiveness.

SUMMARY

The objects of the present invention are to improve the above-mentioned shortcomings in the prior art, and to provide a new method for manufacturing a nonvolatile memory.

In order to achieve the foregoing objects of the present invention, the examples of the present invention provide the following technical solution:

A method for manufacturing a nonvolatile memory comprises the steps of:

forming a gate oxide layer on a substrate;

forming a stacked capacitor of a storage cell after making a logic gate polysilicon undertake at least two deposition processes;

removing the extra logic gate polysilicon by an etching process to form a storage transistor and a peripheral logic transistor removing the logic gate polysilicon in other areas except a selection transistor area and a storage transistor area by the etching process to form a selection transistor and a storage transistor.

In the above method, by integrating the manufacturing process of the memory into a standard logic process, the manufacturing process of the memory can be simplified, the cost can be reduced, and the compatibility between the memory and a logic device can be enhanced.

As a preferred embodiment, forming the stacked capacitor of the storage cell after making the logic gate polysilicon undertake two deposition processes comprises the following steps:

depositing the logic gate polysilicon for the first time, and removing a part of the logic gate polysilicon in a storage cell area to form a floating gate of the storage transistor;

generating an inter-gate dielectric layer to form an inter-gate dielectric layer of the storage transistor;

removing an inter-gate dielectric layer of the selection transistor area;

depositing the logic gate polysilicon for the second time to form a control gate of the storage transistor, and forming the gate of the selection transistor via two depositions.

In a more preferred solution, the total thickness of the logic gate polysilicon deposited for the first time and the logic gate polysilicon deposited for the second time is equal to the thickness of the standard logic gate polysilicon. By limiting the thickness of a stacked power supply of the storage cell to be equal to the thickness of the standard logic gate polysilicon, the compatibility between the memory and a peripheral logic device can be enhanced.

In a further optimized solution, the step of removing the inter-gate dielectric layer of the selection transistor area is replaced by the following step: removing the inter-gate dielectric layers in the selection transistor area and a peripheral logic transistor area;

The step of removing the logic gate polysilicon in the other areas except the selection transistor area and the storage transistor area by the etching process to form the selection transistor and the storage transistor is replaced by the following step: removing the logic gate polysilicon in the other areas except the selection transistor area, the storage transistor area and the peripheral logic transistor area by the etching process to form the selection transistor, the storage transistor, and a peripheral logic transistor. In this further optimized solution, a peripheral transistor is also generated while the selection transistor and the storage transistor are generated.

The above method is a manufacturing method of a two-transistor memory that simultaneously generates the storage transistor and the selection transistor, the present invention also provides a manufacturing method of generating a structure of an erasable and programmable read-only memory with a tunnel oxide in the following:

A method for manufacturing a nonvolatile memory comprises the steps of:

forming a gate oxide layer on a substrate;

forming a stacked capacitor of a storage cell after making a logic gate polysilicon undertake at least two deposition processes;

removing the logic gate polysilicon in other areas except a storage transistor area by an etching process to form a storage transistor.

As a preferred embodiment, forming the stacked capacitor of the storage cell after making the logic gate polysilicon undertake two deposition processes comprises the following steps:

depositing the logic gate polysilicon for the first time, and removing a part of the logic gate polysilicon in a storage cell area to form a floating gate of the storage transistor;

generating an inter-gate dielectric layer to form an inter-gate dielectric layer of the storage transistor;

depositing the logic gate polysilicon for the second time to form a control gate of the storage transistor.

Further, the total thickness of the logic gate polysilicon deposited for the first time and the logic gate polysilicon deposited for the second time is equal to the thickness of a standard logic gate polysilicon.

In one embodiment, before the gate oxide layer is formed on the substrate, the method further comprises a step of forming a tunnel dielectric layer in the storage cell area. Generally, the storage transistor can directly use the gate oxide layer as the tunnel dielectric layer, but in some cases, the thickness of the gate oxide layer may not be sufficient, at this time, a tunnel dielectric layer may be formed on the substrate in advance. If the gate oxide layer is not used as the tunnel dielectric layer of the storage transistor, before the step of forming the gate oxide layer in the standard logic process, a layer of a tunnel dielectric material is formed as the tunnel dielectric layer of the storage transistor. The tunnel dielectric layer and the gate oxide layer can be formed using the same material.

As an embodiment, in the step of removing a part of the logic gate polysilicon in the storage cell area, one photomask is used to remove a part of the logic gate polysilicon in the storage cell area by the etching process.

As an embodiment, in the step of removing the inter-gate dielectric layer of the peripheral logic transistor area, the inter-gate dielectric layer in the peripheral logic transistor area is removed by a dry etching process or a wet etching process.

As an embodiment, the inter-gate dielectric layer is an oxide or a nitride or other materials that meet the requirements of the inter-gate dielectric layer.

Compared with the prior art, the method for manufacturing the nonvolatile memory according to the present invention forms the stacked capacitor (the floating gate and the control gate) of the storage cell by depositing the polysilicon of a standard logic gate twice or more, the thickness of the polysilicon after the two depositions is the same as that of the standard logic gate. This production process is to integrate the production process of the memory into the production process of the logic device. The process step of producing the logic device is also the step of producing the memory, therefore, the production process of the memory is simpler, the compatibility between the memory and the logic device is better, and the manufacturing cost of the memory is also reduced.

BRIEF DESCRIPTION OF THE DRAWINGS

In order to explain the technical solution of the examples of the present invention more clearly, the drawings used in the examples are briefly introduced below. It should be understood that the following drawings only show some examples of the present invention, which should not be regarded as a limitation on the scope, for a person skilled in the art, other related drawings can be obtained based on these drawings without paying creative work.

EXPLANATION OF REFERENCE SIGNS IN THE DRAWINGS

Figure 1:
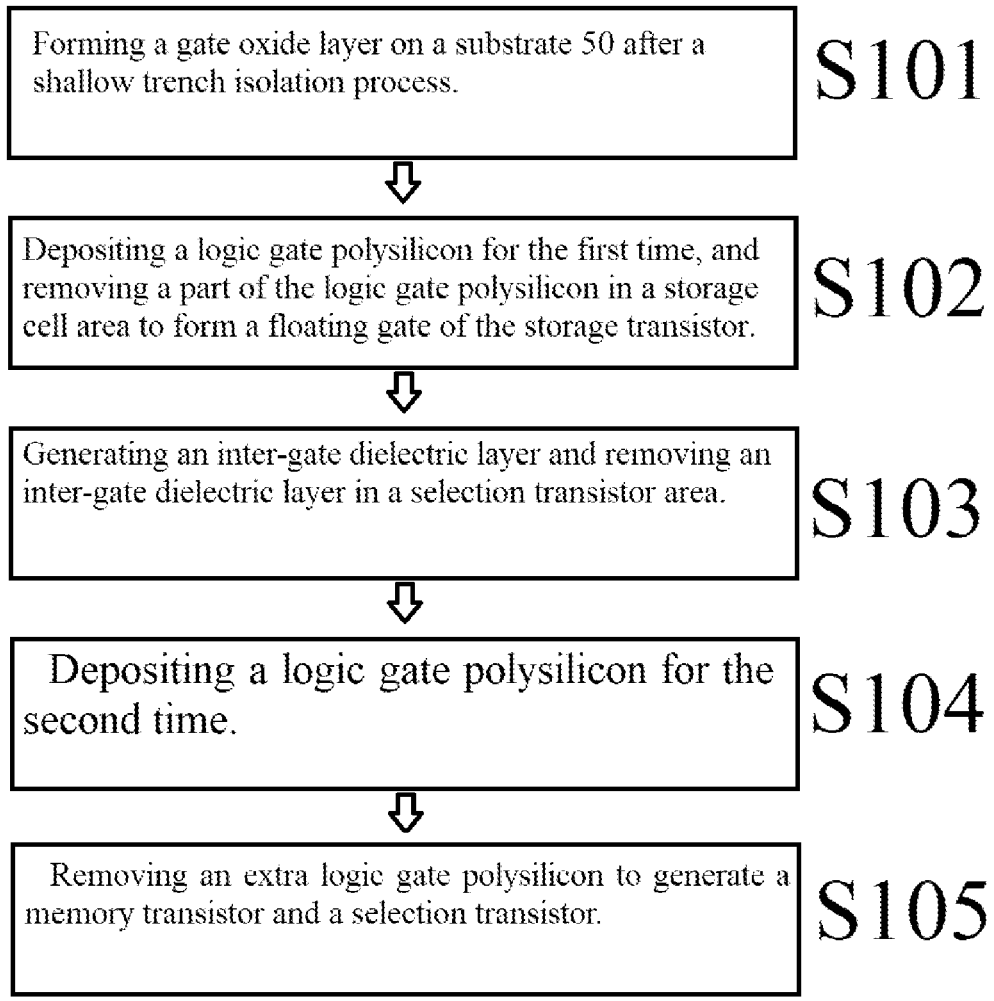
FIG. 1 is a flowchart of generating a two-transistor type nonvolatile memory provided by an example of the present invention.

10. Logical gate polysilicon deposited for the first time; 10'. Logical gate polysilicon deposited for the second time; 20. Isolation channel; 30. Active area; 40. Doped area; 50. Substrate; 60. Gate oxide layer; 70. Inter-gate dielectric layer.

DETAILED DESCRIPTION

In the following, the technical solution in the examples of the present invention will be clearly and completely described with reference to the drawings in the examples of the present invention, obviously, the described examples are only a part of the examples of the present invention, but not all of the examples. The components of examples of the invention, generally described and illustrated in the drawings herein, can be arranged and designed in a variety of different configurations. Therefore, the following detailed description of the examples of the present invention provided in the drawings is not intended to limit the scope of the claimed invention, but merely represents selected examples of the present invention. Based on the examples of the present invention, all other examples obtained by a person skilled in the art without creative work fall into the protection scope of the present invention.

Please refer to FIG. 1, in Example 1 of the present invention, a method for manufacturing a nonvolatile memory comprises the following steps:

S101: forming a gate oxide layer 60 on a substrate 50 after a shallow trench isolation process and a well area forming process via a gate oxide material forming process.

Figure 3:
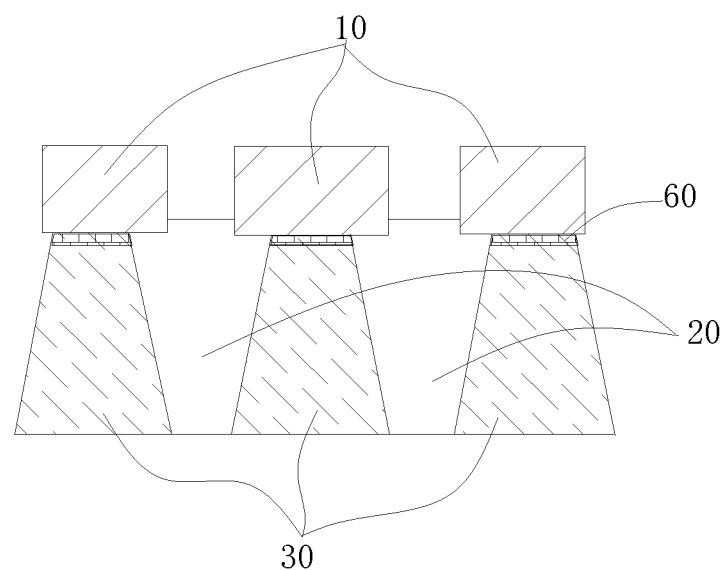
FIG. 3 is a sectional view taken along a direction A-A of FIG. 2.

Referring to FIG. 3, after the shallow trench isolation process, an isolation trench (STI) 20 and an active area 30 are formed on the substrate 50; after the well area forming process, a well area is formed on the substrate 50 (Not shown).

Generally, a gate oxide layer can be directly used in a storage transistor, but in some cases, the thickness of the gate oxide layer may not be sufficient, in this case, a tunnel dielectric layer may be formed on the substrate before the gate oxide layer is formed. The tunnel dielectric layer and the gate oxide layer can be formed using the same material.

S102: depositing a logic gate polysilicon for the first time, and removing a part of the logic gate polysilicon in a storage cell area to form a floating gate of the storage transistor. A part of the logic gate polysilicon in the storage cell area can be removed by an etching process using one photomask. A structure formed after this step is shown in FIG. 2 and FIG. 3, in FIG. 3, in a storage transistor area, the logic gate polysilicon 10 deposited for the first time is the floating gate of the storage transistor, that is to say, the floating gate of the storage transistor generated by the method is a logic gate polysilicon material.

Figure 2:
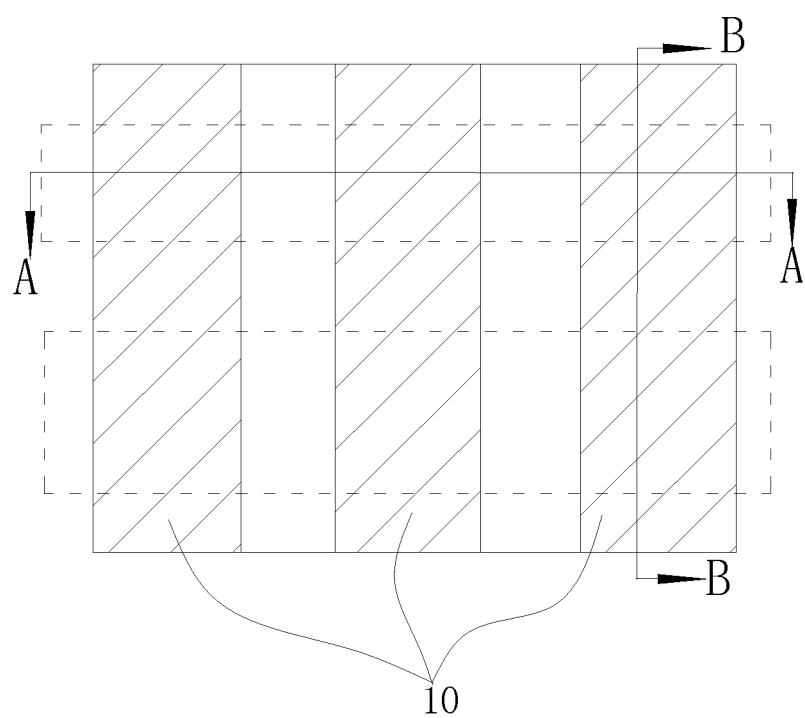
FIG. 2 is a top view of a structure formed after Step S102 in a method shown in FIG. 1.

In FIG. 2, two dashed boxes represent the storage transistor area (the dashed box located above in FIG. 2) and a selection transistor area (the dashed box located below in FIG. 2), respectively, the storage cell area comprises the storage transistor area and the selection transistor area, a part of the removed logic gate polysilicon in the storage cell area in this step refers to a part of the removed logic gate polysilicon in the storage cell area, as shown in FIG. 2, a blank area in FIG. 2 is an area covered by a part of the removed logic gate polysilicon (before being removed), from FIG. 2, it can be seen that the blank area is perpendicular to the storage transistor area and the selection transistor area.

Step S103: generating an inter-gate dielectric layer 70, in the storage transistor area, the inter-gate dielectric layer is an inter-gate dielectric layer of the storage transistor. The inter-gate dielectric layer may use an oxide or a nitride.

Figure 4:
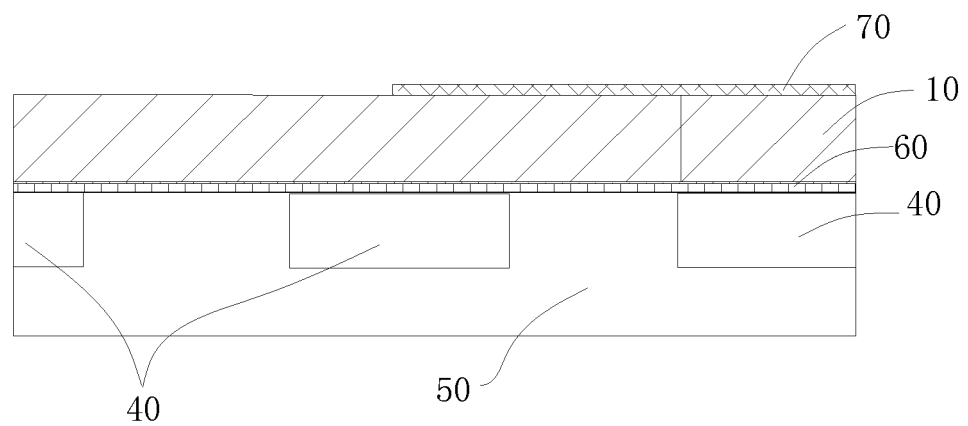
FIG. 4 is a sectional view of a structure formed after Step S103 along a direction B-B shown in FIG. 2.
Figure 5:
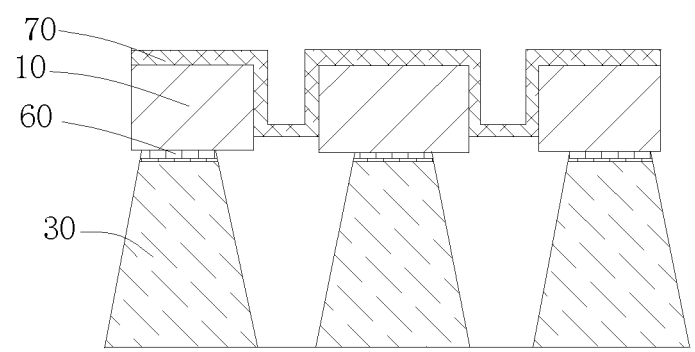
FIG. 5 is a sectional view of a structure formed in a storage transistor area after Step S103 along a direction A-A shown in FIG. 2.

In this example, if a single-transistor-type memory is generated, in Step S103, only an inter-gate dielectric layer needs to be generated. If a two-transistor-type memory is generated, since the inter-gate dielectric layer does not exist in the structure of a selection transistor, in Step S103, after the inter-gate dielectric layer is generated, the inter-gate dielectric layer in the selection transistor area is also removed, as shown in FIG. 4, the inter-gate dielectric layer may be reserved only in the storage transistor area as the inter-gate dielectric layer of the storage transistor. A cross-sectional view of the storage transistor is shown in FIG. 5. The inter-gate dielectric layer in the selection transistor area can be removed by a dry etching process or a wet etching process.

It should be noted that, in order to show more vividly, a drain doped area 40 is marked in FIGS. 4 and 5, but in a process flow, the doped area 40 is formed after Step S105.

Figure 6:
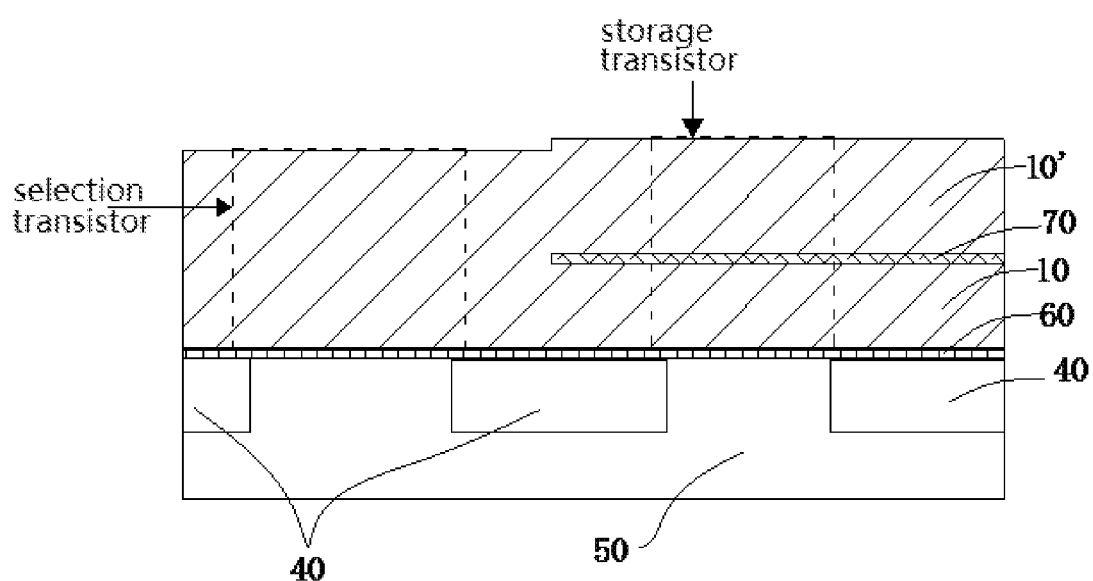
FIG. 6 is a sectional view of a structure formed after Step S104 along a direction B-B shown in FIG. 2.
Figure 7:
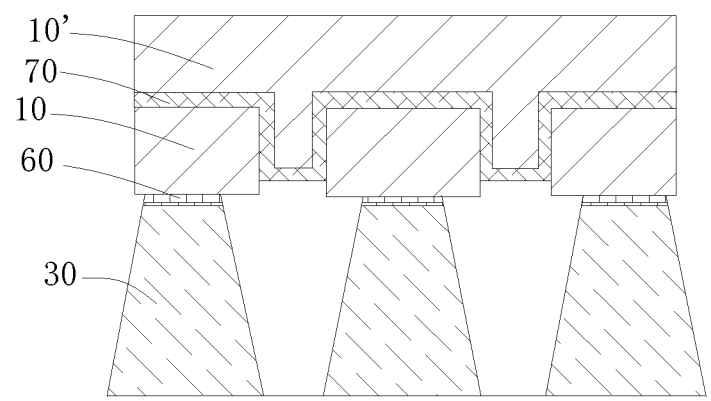
FIG. 7 is a sectional view of a structure formed in a storage transistor area after Step S104 along a direction A-A shown in FIG. 2.

S104: depositing the logic gate polysilicon for the second time, in the storage transistor area, the logic gate polysilicon deposited for the second time forms a control gate of the storage transistor. In the case of a two-transistor memory, the logic gate polysilicon deposited twice forms the gate of the selection transistor. As shown in FIG. 6 and FIG. 7, the logic gate polysilicon 10 deposited for the first time and the logic gate polysilicon 10' deposited for the second time constitute the floating gate and the control gate of the storage transistor, respectively. the logic gate polysilicon 10 deposited for the first time and the logic gate polysilicon 10' deposited for the second time as a whole constitute the gate of the selection transistor. The dashed boxes in FIG. 6 indicate the gate area (the dashed box on the left) in the selection transistor, and the areas of the floating gate, the inter-gate dielectric layer, and the control gate in the storage transistor (the dotted box on the right), respectively.

The total thickness of the logic gate polysilicon deposited for the first time and the logic gate polysilicon deposited for the second time is equal to the thickness of the standard logic gate polysilicon, that is to say, for the storage transistor, the total thickness of the floating gate and the control gate is equal to the thickness of a standard logic gate polysilicon, for the selection transistor, the thickness of a gate of the selection transistor is equal to the thickness of the standard logic gate polysilicon to ensure that a standard logic device is not affected, and to enhance the compatibility between the memory and the standard logic device as shown in FIG. 6.

Step S105: removing the logic gate polysilicon in other areas except the storage transistor area by a polysilicon etching process to form the storage transistor. For a two-transistor memory, in this step, it is necessary to remove the logic gate polysilicon in other areas except the selection transistor area and the storage transistor area by the etching process to form the selection transistor and the storage transistor, as shown in FIG. 8, the generated selection transistor comprises the gate oxide layer and the gate, the storage transistor comprises the gate oxide layer, the floating gate, the inter-gate dielectric layer, and the control gate, the floating gate and the control gate are both logic gate polysilicon materials.

Figure 8:
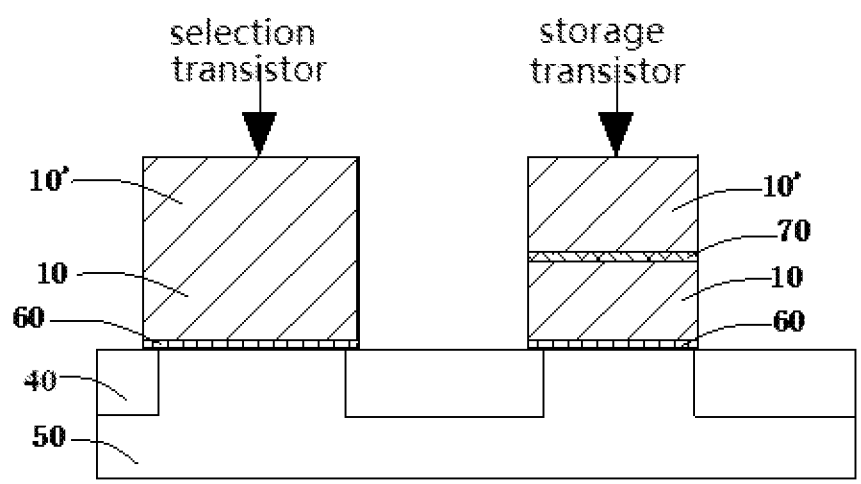
FIG. 8 is a sectional view of a selection transistor and a storage transistor formed after Step S105 along a direction B-B shown in FIG. 2.

It is easy to understand that when the storage transistor and the selection transistor are generated, if the inter-gate dielectric layer is removed in Step S103 and only the inter-gate dielectric layer remains in the storage transistor area, the storage transistor and the selection transistor can be directly generated after Step S105; when the inter-gate dielectric layer is removed in Step S103, if the inter-gate dielectric layer remains in the storage transistor area and other areas (non-selection transistor areas), as shown in FIG. 6 (in FIG. 6, the inter-gate dielectric layer is also retained in the surrounding area of the storage transistor area), after Step S105, the extra inter-gate dielectric layer needs to be removed to generate the storage transistor and the selection transistor, as shown in FIG. 8. In other words, Step S103 of removing the inter-gate dielectric layer in the selection transistor area or the later description of removing the inter-gate dielectric layer of the selection transistor area and a peripheral logic transistor area can be replaced by the step of removing the inter-gate dielectric layers in other areas except the storage transistor area.

It should be noted that, in the above method, the stacked capacitor of the storage cell is formed by two depositions, as another embodiment, the stacked capacitor of the storage cell may also be formed by three or more depositions, for example, when the floating gate of the storage transistor is formed, a part of the logic gate polysilicon of the storage cell area is deposited twice and removed. In addition, in the above method, the purpose of limiting the total thickness of the logic gate polysilicon deposited for the first time and the logic gate polysilicon deposited for the second time to be equal to the thickness of the standard logic-gate polysilicon is to further enhance the compatibility of the memory and the logic device, for a situation with less demand, this need not be so limited.

The standard logic process has the following order: the isolation of an STI shallow trench→the formation of a well area→the gate oxide layer→the deposition of a logic polysilicon→the etching of the logic polysilicon. The above manufacturing method is based on the standard logic process, the deposition of the logic polysilicon is divided into two steps, after the first step of the deposition of the logical polysilicon, the etching of the polysilicon is performed on the storage cell area via one photomask to form the floating gate of the storage transistor, then, the inter-gate dielectric layer is formed, and the inter-gate dielectric layer of the storage transistor area is removed and then performed with the second deposition of the logical polysilicon to finally form the selection transistor, the storage transistor, a peripheral logic transistor described in the second example, and other peripheral devices by the etching of the polysilicon.

That is to say, in the above method, the production process of the memory is integrated into the standard logic process, and the memory can be produced in the process of producing standard logic device at the same time, which simplifies the production process of the memory, reduces cost, and improves the compatibility between the memory and the logic device. In other words, since the memory is generated by integrating in a standard logic process, the peripheral logic transistor and other peripheral logic devices can be generated at the same time by the above method, and only a simple change is required in some steps of the above method.

Figure 9:
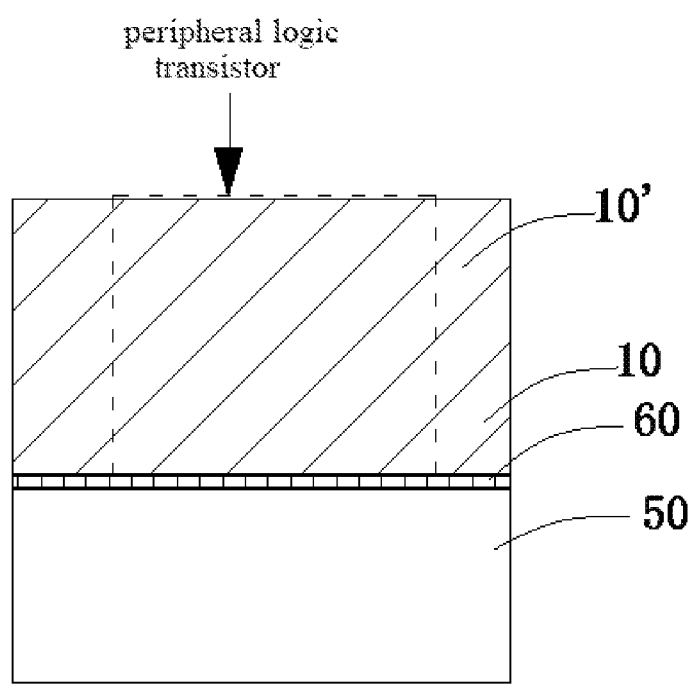
FIG. 9 is a sectional view of a structure of a peripheral logic transistor area formed after Step S104 in a method according to Example 2 along a direction A-A shown in FIG. 2.
Figure 10:
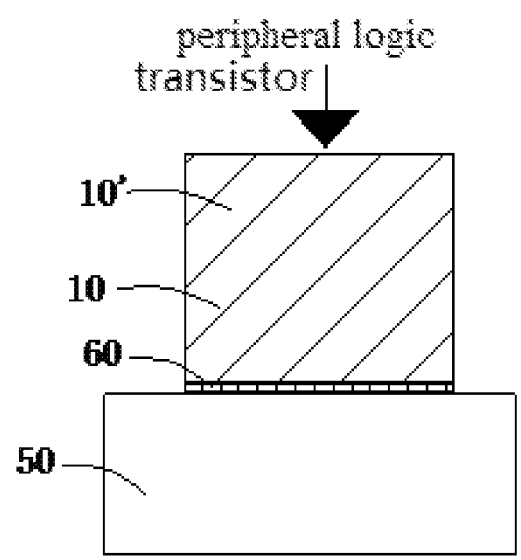
FIG. 10 is a sectional view of a peripheral logic transistor formed after Step S105 in a method according to Example 2 along a direction B-B shown in FIG. 2.

Taking the simultaneous generation of the peripheral logic transistor as an example, specifically, in Example 2 of the present invention, in Step S103 of the method described in Example 1, when the inter-gate dielectric layer is removed, the inter-gate dielectric layer of the peripheral logic transistor also needs to be removed. In Step S105, the logic polysilicon in the peripheral logic transistor area cannot be removed, because in Step S104, in the peripheral logic transistor area, the logic gate polysilicon deposited twice forms a logic gate of the peripheral logic transistor, as shown in FIG. 9, the dotted frame area in FIG. 9 is a logic gate area of the peripheral logic transistor. That is, in Step S105, the logic gate polysilicon in other areas except the selection transistor area, the storage transistor area, and the peripheral logic transistor area is removed by the etching process to finally form the selection transistor, the storage transistor, and the peripheral logic transistor, as shown in FIG. 10.

The above are only specific embodiments of the present invention, but the protection scope of the present invention is not limited to this, a person skilled in the art can easily think of changes or replacements within the technical scope disclosed by the present invention, which should be covered by the protection scope of the present invention.

We claim:

1. A method for manufacturing a nonvolatile memory by integrating a manufacturing process of the nonvolatile memory into a standard logic process, comprising:
   forming a gate oxide layer on a substrate;
   depositing a first logic gate polysilicon layer in a peripheral logic area, a selection transistor area, and a storage cell area of the substrate;
   removing a part of the first logic gate polysilicon layer in the storage cell area to form a floating gate of a storage transistor;
   forming an inter-gate dielectric layer on the first logic gate polysilicon layer;
   removing the inter-gate dielectric layer in the peripheral logic area and the selection transistor area;
   depositing a second logic gate polysilicon layer on the inter-gate dielectric layer in the storage cell area and on the first logic gate polysilicon layer in the peripheral logic area and the selection transistor area; and
   etching the second logic gate polysilicon layer to form a control gate in the storage cell area and the first and second logic gate polysilicon layers in the selection transistor area and the peripheral logic area to form a selection transistor and a peripheral logic transistor;
   wherein the first and second logic gate polysilicon layers in the peripheral logic transistor and the selection transistor have a total thickness equal to a combined thickness of the control gate and the floating gate.

2. The method according to claim 1, wherein etching the second logic gate polysilicon layer in the storage cell area forms a stacked capacitor in the storage cell area.

3. The method according to claim 1, wherein before forming the gate oxide layer on the substrate, the method further comprises forming a tunnel dielectric layer in the storage cell area.

4. The method according to claim 1, wherein removing the part of the first logic gate polysilicon layer in the storage cell area comprises forming one photomask on the first logic gate polysilicon layer in the storage cell area and etching the first logic gate polysilicon layer.

5. The method according to claim 1, wherein removing the inter-gate dielectric layer in the selection transistor area comprises a dry etching process or a wet etching process.

6. The method according to claim 1, wherein removing the inter-gate dielectric layer in the selection transistor area comprises removing the inter-gate dielectric layer in all areas other than the storage transistor area of the substrate.

7. The method according to claim 1, wherein removing the inter-gate dielectric layer in the peripheral logic area and the selection transistor area comprises a dry etching process.

8. The method according to claim 1, wherein the inter-gate dielectric layer comprises an oxide or a nitride.

9. The method according to claim 1, wherein:
   the gate oxide layer is formed in the selection transistor area and the peripheral logic transistor area simultaneously;
   the first logic gate polysilicon layer is deposited in the selection transistor area, the storage cell area, and the peripheral logic area simultaneously;
   the inter-gate dielectric layer is removed in the selection transistor area and the peripheral logic area simultaneously;
   the second logic gate polysilicon layer is deposited on the inter-gate dielectric layer in the storage cell area and on the first logic gate polysilicon layer in the selection transistor area and the peripheral logic area simultaneously; and
   the second logic gate polysilicon layer in the selection transistor area, the storage transistor area and the peripheral logic area are etched simultaneously.

10. A method for manufacturing a nonvolatile memory by integrating a manufacturing process of the nonvolatile memory into a standard logic process, comprising:
    forming a gate oxide layer on a substrate;
    depositing a first logic gate polysilicon layer in a peripheral logic area and a storage cell area of the substrate;
    forming an inter-gate dielectric layer on the first logic gate polysilicon layer;
    removing the inter-gate dielectric layer in the peripheral logic area;
    depositing a second logic gate polysilicon layer on the inter-gate dielectric layer in the storage cell area and on the first logic gate polysilicon layer in the peripheral logic area; and
    removing parts of the first and second logic gate polysilicon layers in the peripheral logic area and parts of the first and second logic gate polysilicon layers and the inter-gate dielectric layer in the storage transistor area by an etching process to form a peripheral logic transistor and a storage transistor having a control gate and a floating gate, respectively;
    wherein the first and second logic gate polysilicon layers in the peripheral logic transistor have a total thickness equal to a combined thickness of the control gate and the floating gate.

11. The method according to claim 10, wherein removing parts of the first and second logic gate polysilicon layers and the inter-gate dielectric layer in the storage cell area forms a stacked capacitor in the storage cell area.

12. The method according to claim 10, wherein the substrate further comprises a selection transistor area, and the method further comprises:
    forming the gate oxide layer in the selection transistor area;

depositing the first logic gate polysilicon in the selection transistor area;

removing the inter-gate dielectric layer in the selection transistor area; and removing parts of the first and second logic gate polysilicon layers in the selection transistor area by the etching process to form selection transistor.

13. The method according to claim 12, wherein removing the inter-gate dielectric layer in the selection transistor area and the peripheral logic transistor area comprises a dry etching process.

14. The method according to claim 12, wherein removing the inter-gate dielectric layer in the peripheral logic area comprises a wet etching process.

15. The method according to claim 12, wherein:

the gate oxide layer is formed in the selection transistor area and the peripheral logic transistor area;

the first logic gate polysilicon layer is deposited in the storage cell area, the selection transistor area, and the peripheral logic area simultaneously;

the inter-gate dielectric layer is removed in the selection transistor area and the peripheral logic transistor area simultaneously;

the second logic gate polysilicon layer is deposited on the inter-gate dielectric layer in the storage cell area and on the first logic gate polysilicon layer in the selection transistor area and the peripheral logic area simultaneously; and the first and second logic gate polysilicon layers in the storage transistor area, the selection transistor area, and the peripheral logic transistor area are etched simultaneously.

16. The method according to claim 10, wherein before forming the gate oxide layer on the substrate, the method further comprises forming a tunnel dielectric layer in the storage cell area.

17. The method according to claim 10, wherein the inter-gate dielectric layer comprises an oxide or a nitride.

18. The method according to claim 10, wherein:

the gate oxide layer is formed in the peripheral logic transistor area;

the first logic gate polysilicon layer is deposited in the storage cell area and the peripheral logic area simultaneously;

the second logic gate polysilicon layer is deposited on the inter-gate dielectric layer in the storage cell area and on the first logic gate polysilicon layer in the peripheral logic area simultaneously; and the first and second logic gate polysilicon layers in the storage transistor area and the peripheral logic transistor area are etched simultaneously.

* * * * *